United States Patent
Iwamoto et al.

(10) Patent No.: US 11,114,822 B2
(45) Date of Patent: Sep. 7, 2021

(54) OPTICAL SEMICONDUCTOR ELEMENT

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventors: Masanobu Iwamoto, Kanazawa (JP); Hideto Sugawara, Nonoichi (JP); Kenji Isomoto, Kanazawa (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/789,639

(22) Filed: Feb. 13, 2020

(65) Prior Publication Data

US 2021/0066888 A1    Mar. 4, 2021

(30) Foreign Application Priority Data

Aug. 27, 2019 (JP) .............................. JP2019-154590
Jan. 27, 2020 (JP) .............................. JP2020-011009
Feb. 4, 2020 (JP) .............................. JP2020-017199

(51) Int. Cl.
*H01S 5/343* (2006.01)
*H01S 5/125* (2006.01)
*H01S 5/22* (2006.01)

(52) U.S. Cl.
CPC ........ *H01S 5/34353* (2013.01); *H01S 5/2228* (2013.01); *H01S 5/125* (2013.01)

(58) Field of Classification Search
CPC .... H01S 5/34353; H01S 5/125; H01S 5/2228; H01S 5/343; H01L 133/00; H01L 33/00
(Continued)

(56) References Cited

U.S. PATENT DOCUMENTS

| 5,929,461 A | 7/1999 | Yamaguchi et al. |
| 7,683,378 B2 | 3/2010 | Kako et al. |

(Continued)

FOREIGN PATENT DOCUMENTS

| JP | 10-004240 A | 1/1998 |
| JP | 2006-270073 A | 10/2006 |

(Continued)

*Primary Examiner* — Tuan N Nguyen
(74) *Attorney, Agent, or Firm* — Oblon, McClelland, Maier & Neustadt, L.L.P.

(57) ABSTRACT

According to one embodiment, an optical semiconductor element includes a substrate, a light emitting layer, and a distributed Bragg reflector. The light emitting layer includes an AlGaAs multi quantum well layer. The distributed Bragg reflector is provided between the substrate and the light emitting layer. A pair of a first layer and a second layer is periodically stacked in the distributed Bragg reflector. The first layer includes $Al_xGa_{1-x}As$. The second layer includes $In_z(Al_yGa_{1-y})_{1-z}P$. A refractive index $n_1$ of the first layer is higher than a refractive index $n_2$ of the second layer. The first layer has a thickness larger than $\lambda 0/(4n_1)$ where $\lambda 0$ is a center wavelength of a band on wavelength distribution of a reflectivity of the distributed Bragg reflector. The second layer has a thickness smaller than $\lambda 0/(4n_2)$.

3 Claims, 6 Drawing Sheets

(58) Field of Classification Search
USPC .......................................... 372/43.01, 50.11
See application file for complete search history.

(56) References Cited

U.S. PATENT DOCUMENTS

| | | | |
|---|---|---|---|
| 7,903,711 B1 * | 3/2011 | Hasenberg | ............ H01S 5/2004 |
| | | | 372/45.01 |
| 9,099,628 B2 | 8/2015 | Ito | |
| 2003/0086467 A1 * | 5/2003 | Modak | .................. H01L 33/105 |
| | | | 372/96 |
| 2007/0223546 A1 * | 9/2007 | Brenner | .............. H01S 5/18333 |
| | | | 372/43.01 |
| 2012/0146072 A1 * | 6/2012 | Yamasaki | ............... H01L 33/16 |
| | | | 257/98 |
| 2012/0235191 A1 * | 9/2012 | Ishida | ................... H01L 25/167 |
| | | | 257/98 |

FOREIGN PATENT DOCUMENTS

| | | |
|---|---|---|
| JP | 2012-199293 A | 10/2012 |
| JP | 2016-129189 A | 7/2016 |
| JP | 2018-050070 A | 3/2018 |

\* cited by examiner

OPTICAL SEMICONDUCTOR ELEMENT

CROSS-REFERENCE TO RELATED APPLICATIONS

This application is based upon and claims the benefit of priority from Japanese Patent Application No. 2019-154590, filed on Aug. 27, 2019, Japanese Patent Application No. 2020-011009, filed on Jan. 27, 2020, and Japanese Patent Application No. 2020-017199, filed on Feb. 4, 2020; the entire contents of which are incorporated herein by reference.

FIELD

Embodiments described herein relate generally to an optical semiconductor element.

BACKGROUND

When a distribute Bragg reflector (DBR) is provided between a light emitting layer and a substrate, light directed from the light emitting layer toward the substrate can be reflected and high power infrared light can be emitted upward.

In a DBR in which two layers having different refractive index are stacked, the crystal growth temperature varies within a lot and from lot to lot, so that the wavelength at which the DBR reflectance becomes maximum changes, and the in-plane optical output of the optical semiconductor element wafer varies.

DETAILED DESCRIPTION

According to one embodiment, an optical semiconductor element includes a substrate, a light emitting layer, and a distributed Bragg reflector. The light emitting layer includes an AlGaAs multi quantum well layer. The distributed Bragg reflector is provided between the substrate and the light emitting layer. A pair of a first layer and a second layer is periodically stacked in the distributed Bragg reflector. The first layer includes $Al_xGa_{1-x}As$. The second layer includes $In_z(Al_yGa_{1-y})_{1-z}P$. A refractive index $n_1$ of the first layer is higher than a refractive index $n_2$ of the second layer. The first layer has a thickness larger than $\lambda 0/(4n_1)$ where $\lambda 0$ is a center wavelength of a band on wavelength distribution of a reflectivity of the distributed Bragg reflector. The second layer has a thickness smaller than $\lambda 0/(4n_2)$.

Various embodiments are described below with reference to the accompanying drawings.

Figure 1A:
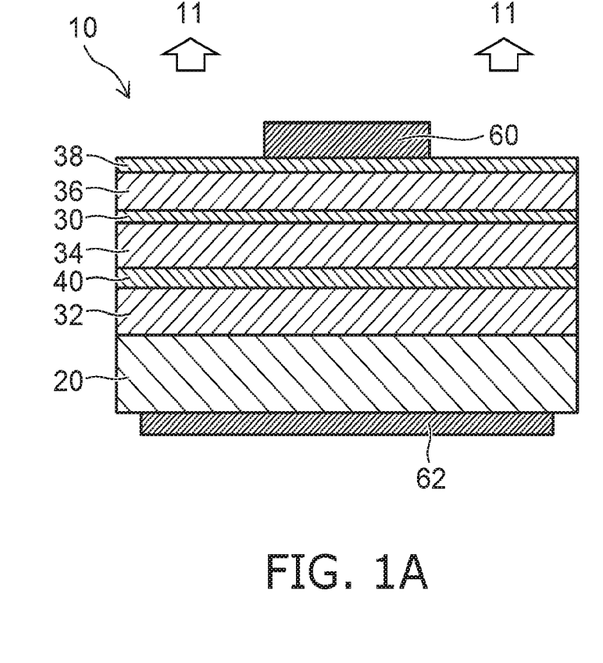
FIG. 1A is a schematic cross-sectional view of an optical semiconductor element according to a first embodiment.
Figure 1B:
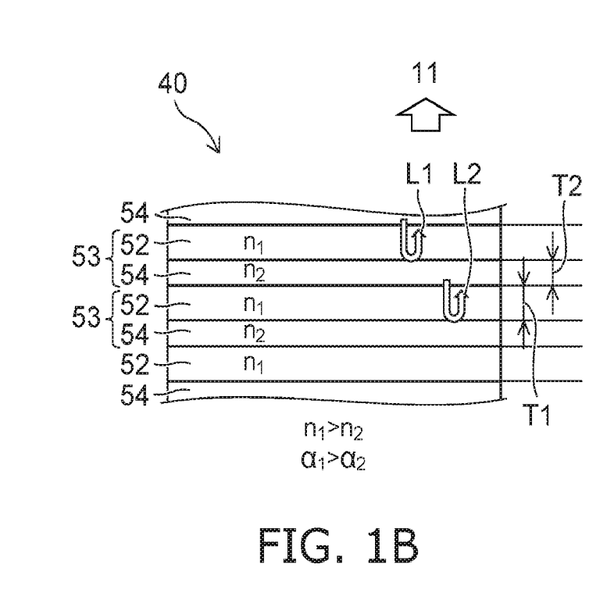
FIG. 1B is a partial schematic side view of a distributed reflector.

FIG. 1A is a schematic cross-sectional view of an optical semiconductor element according to a first embodiment, and FIG. 1B is a partial schematic side view of a distributed reflector.

The optical semiconductor element 10 includes a substrate 20, a light emitting layer 30, and a distributed Bragg reflector 40. The light emitting layer 30 has an $Al_xGa_{1-x}As$ multi quantum well layer (MQW: Multi Quantum Well) structure. The MQW includes a well layer including $Al_xGa_{1-x}As$ and a barrier layer.

The distributed Bragg reflector (DBR) 40 is provided between the substrate 20 and the light emitting layer 30, a pair 53 of a first layer (refractive index is $n_1$) 52 and a second layer (refractive index is $n_2$) 54 is stacked periodically. A periodicity of the pair 53 is set so that a phase difference at a center wavelength $\lambda 0$ corresponds to 180°. The center wavelength $\lambda 0$ is a wavelength at a center of a band on wavelength distribution of a reflectivity in air of the distributed Bragg reflector 40. The first layer 52 includes $Al_xGa_{1-x}As$ and the second layer 54 includes $In_z(Al_yGa_{1-y})_{1-z}P$. The center wavelength $\lambda 0$ is 700 nm or more.

In FIG. 1B, a thickness of the first layer 52 is T1, a phase change passing through the thickness of T1 is $\alpha_1$ (°), and a refractive index is $n_1$. At the center wavelength $\lambda 0$ (in free space), the phase change $\alpha_1$ is expressed by formula (1).

$$\alpha_1(°)=90°\times T1/(\lambda 0/4n_1) \quad (1)$$

Further, a thickness of the second layer 54 is T2, a phase change passing through the thickness of T2 is $\alpha_2$ (°), and a refractive index is $n_2$. At the center wavelength $\lambda 0$, the phase change $\alpha_2$ is expressed by formula (2).

$$\alpha_2(°)=90°\times T2/(\lambda 0/4n_2) \quad (2)$$

Here, it is assumed that the refractive index $n_1$ at wavelength $\lambda 0$ (hereafter expressed "@$\lambda 0$") of the first layer 52 is larger than the refractive index $n_2$ (@$\lambda 0$) of the second layer 54 (n1>n2). At this time, the light L1 is emitted from the light emitting layer 30 and reflected at the interface between the first layer 52 and the second layer 54. The light L2 is emitted from the light emitting layer 30 and reflected at the interface between the first layer 52 and the second layer 54 below by one pair. The phase difference between the light L1 and the light L2 is designed to satisfy $(\alpha_1+\alpha_2)=180°$ (@$\lambda 0$). For this reason, the optical path difference between the light L1 and the light L2 is 360°, and the reflected lights strengthen each other. As a result, by increasing the number of stacked DBRs, the upward reflectivity by the DBR can be increased and the optical output can be increased.

In the first embodiment, the first layer 52 has the thickness T1 larger than a quarter wavelength (in-medium wavelength) at the center wavelength $\lambda 0$, and the second layer 54 has a thickness T2 smaller than the quarter wavelength (in-medium wavelength) at the center wavelength. That is, the phase change $\alpha_1$>the phase change $\alpha_2$.

The optical semiconductor element 10 may further include the substrate 20, a buffer layer 32 provided between the substrate 20 and the DBR 40, a first cladding layer 34 provided between the DBR 40 and the light emitting layer 30, a second cladding layer 36 provided on the light emitting layer 30 and a contact layer 38. By providing an upper electrode 60 on the contact layer 38 and a lower electrode 62 on the back surface of the substrate 20 and injecting current into the light emitting layer 30, light 11 is emitted upward.

The buffer layer 32 includes n-type GaAs and the like. The first layer 52 of the DBR 40 includes n-type $Al_xGa_{1-x}As$ ($0 \le x \le 1$) and the like. The second layer 54 of the DBR 40 includes n-type $In_z(Al_yGa_{1-y})_{1-z}P$ ($0 \le y \le 1$, $0 \le z \le 1$) and the like. The first cladding layer 34 includes n-type $Al_xGa_{1-x}As$ or $In_z(Al_yGa_{1-y})_{1-z}P$ ($0 \le x \le 1$, $0 \le y \le 1$, $0 \le z \le 1$). The light emitting layer 30 includes an $i$-$Al_xGa_{1-x}As$ ($0 \le x \le 1$) multi quantum well layer. The second cladding layer 36 includes n-type $Al_xGa_{1-x}As$ or $In_z(Al_yGa_{1-y})_{1-z}P$ ($0 \le x \le 1$, $0 \le y \le 1$, $0 \le z \le 1$) and the like.

The DBR is formed using a vapor phase growth method such as an MOCVD (Metal Organic Chemical Vapor Deposition) method. When the MOCVD method is used, the film thickness varies due to temperature variations in crystal growth. For this reason, the reflectance of the DBR varies with respect to the design value. For example, when DBRs are stacked with 10 pairs or the like, film thickness variations are accumulated, the DBR reflectance decreases, and the optical output results in decrease.

Next, it will be described that the film thickness variation in the DBR can be reduced by setting $\alpha_1 > \alpha_2$.

Figure 2:
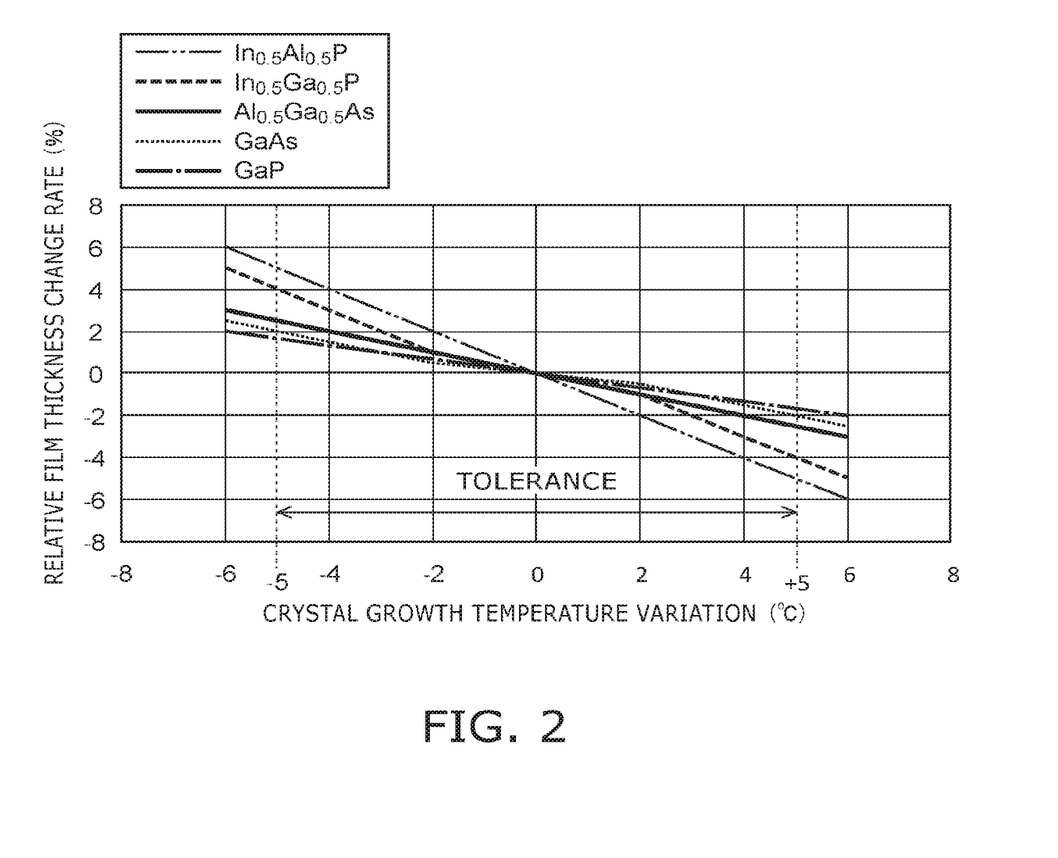
FIG. 2 is a simulation graph view showing dependence of a relative film thickness change rate on variation of a crystal growth temperature.

FIG. 2 is a simulation graph view showing dependence of a relative film thickness change rate on variation of a crystal growth temperature.

The vertical axis represents the relative film thickness change rate (%), and the horizontal axis represents the variation range (° C.) of the crystal growth temperature. The relative film thickness change rates of $In_{0.5}Al_{0.5}P$ and $In_{0.5}Ga_{0.5}P$ are as large as ±5% and ±4%, respectively, in the allowable range of ±5° C. of the crystal growth temperature. On the other hand, the relative film thickness change rate of $Al_{0.5}Ga_{0.5}As$ is as small as ±2.5%. The inventors have found that the relative film thickness change rate can be reduced by reducing the In composition ratio z of the second layer constituting the DBR. For example, the relative film thickness change rate within the allowable range is as low as about 2% or less for GaAs and 1.7% or less for GaP. Further, for example, it was found, in $In_{0.5}Al_{0.5}P$, when the In mixed crystal ratio z is in the range of 0.45 to 0.5, the relative film thickness change rate with respect to the allowable range of ±5° C. of the crystal growth temperature is about ±5%. In the embodiment, the allowable range of temperature variation in the crystal growth is within ±5° C. with respect to the set temperature.

Figure 3A:
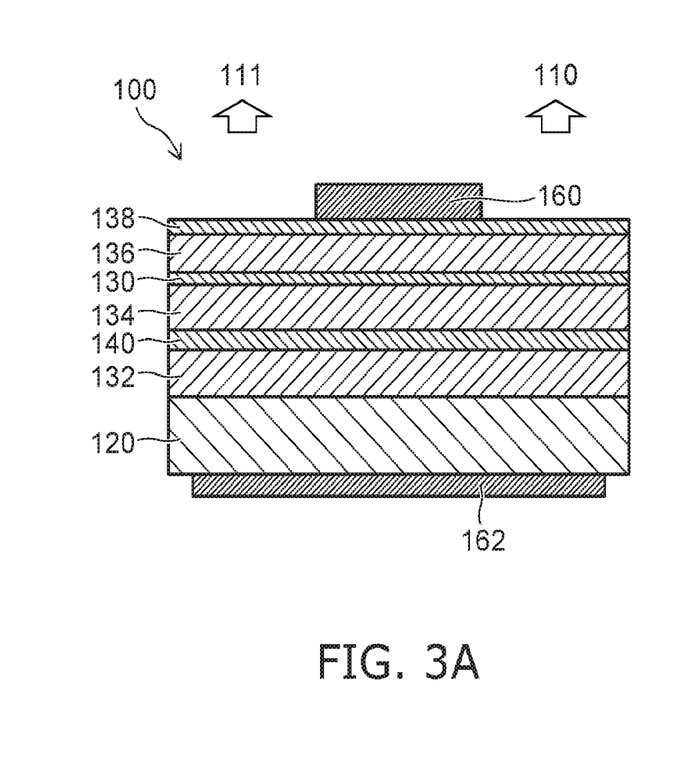
FIG. 3A is a schematic cross-sectional view of an optical semiconductor element according to a comparative example.
Figure 3B:
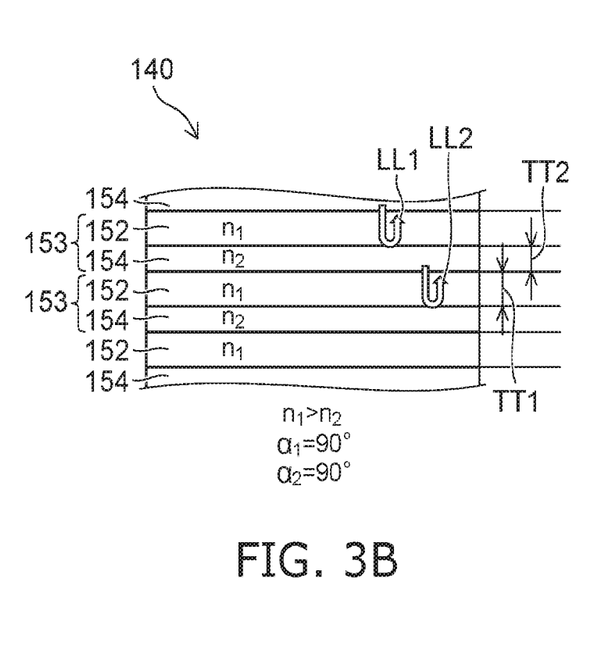
FIG. 3B is a partial schematic side view of a distributed reflector.

FIG. 3A is a schematic cross-sectional view of an optical semiconductor element according to a comparative example, and FIG. 3B is a partial schematic side view of a distributed reflector.

A thickness TT1 of a first layer 152 made of $Al_xGa_{1-x}As$ of the DBR 140 is a quarter wavelength, and a thickness TT2 of a second layer 154 made of $In_z(GaAl)_{1-z}P$ is a quarter wavelength. The thickness TT2 of the second layer 154 of the comparative example is larger than the film thickness T2 of the second layer 54 of the first embodiment. For this reason, in the comparative example, the absolute value of the thickness variation of the second layer 154 represented by the relative film thickness change rate×TT2 is larger than the absolute value of the thickness variation of the second layer 54 of the first embodiment represented by the relative film thickness change rate×T2.

Figure 4:
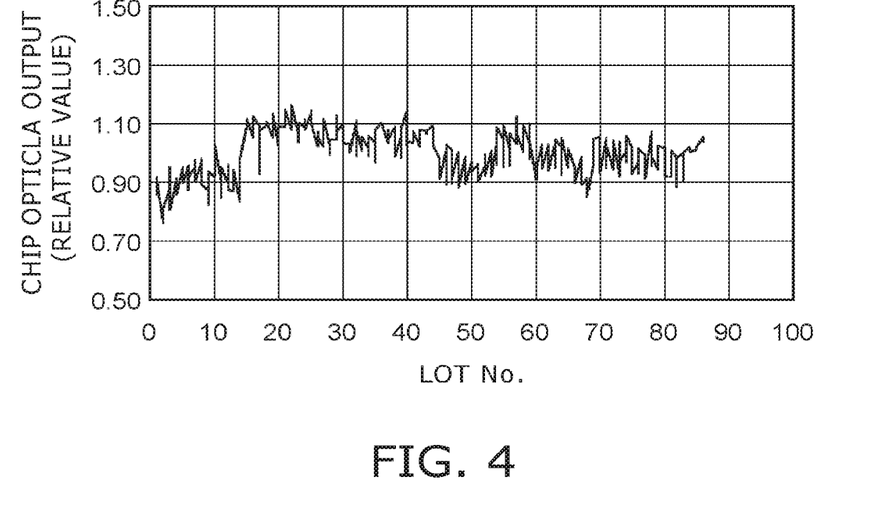
FIG. 4 is a graph view showing an average value of chip optical outputs by lot of the comparative example.

FIG. 4 is a graph view showing an average value of chip optical outputs by lot of the comparative example.

The vertical axis represents the relative value of the average value of the chip optical output (measured value), and the horizontal axis represents the crystal growth lot number. The variation range of the DBR film thickness distribution increases due to the variation of the crystal growth temperature. For this reason, the variation range of the relative reflectance of the DBR for each lot becomes large, and the relative value of the chip optical output varies greatly between 0.75 and 1.15.

On the other hand, in the first embodiment, since the thickness T2 of the second layer 54 is smaller than the quarter wavelength, the thickness T1 of the first layer 52 is made larger than the quarter wavelength, and thus, the phase change ($\alpha_1 + \alpha_2$) is kept at 180°. Even if the thickness T1 of the first layer 52 is not less than the quarter wavelength, the relative film thickness change rate is as small as 2.5% or less, therefore the relative film thickness change rate as the entire DBR can be more reduced than the comparative example. For this reason, in the first embodiment, the variation in relative reflectance of the DBR is reduced with respect to the allowable range of variation in the crystal growth temperature, and the variation in the optical output from lot to lot is reduced.

For example, when the first layer 52 is $Al_{0.2}Ga_{0.8}As$, the refractive index $n_1$ is about 3.55 at 770 nm, and the in-medium wavelength is about 54.2 nm. When the second layer 54 is made of $In_{0.5}Al_{0.5}P$, the refractive index $n_2$ is about 3.12 at 770 nm, and the in-medium wavelength is about 61.7 nm. When the DBR is formed of such layers, $n_1 > n_2$ can be satisfied. For example, when the thickness T2 of the second layer 54 is 56.1 nm (corresponding to $\alpha_2 = 82°$, the thickness T1 of the first layer 52 is 59 nm (corresponding to $\alpha_1 = 98°$. The reflectance can be increased by keeping the phase change of one pair of DBRs to be 180°.

Note that the phase change $\alpha_2$ can be made, for example, 30° or more and smaller than 90° by the second layer 54. If the phase change $\alpha_2$ is too small, the DBR reflection characteristics with respect to the wavelength may be deteriorated. Therefore, the lower limit of the phase change $\alpha_2$ is set to 30°, for example.

Figure 5:
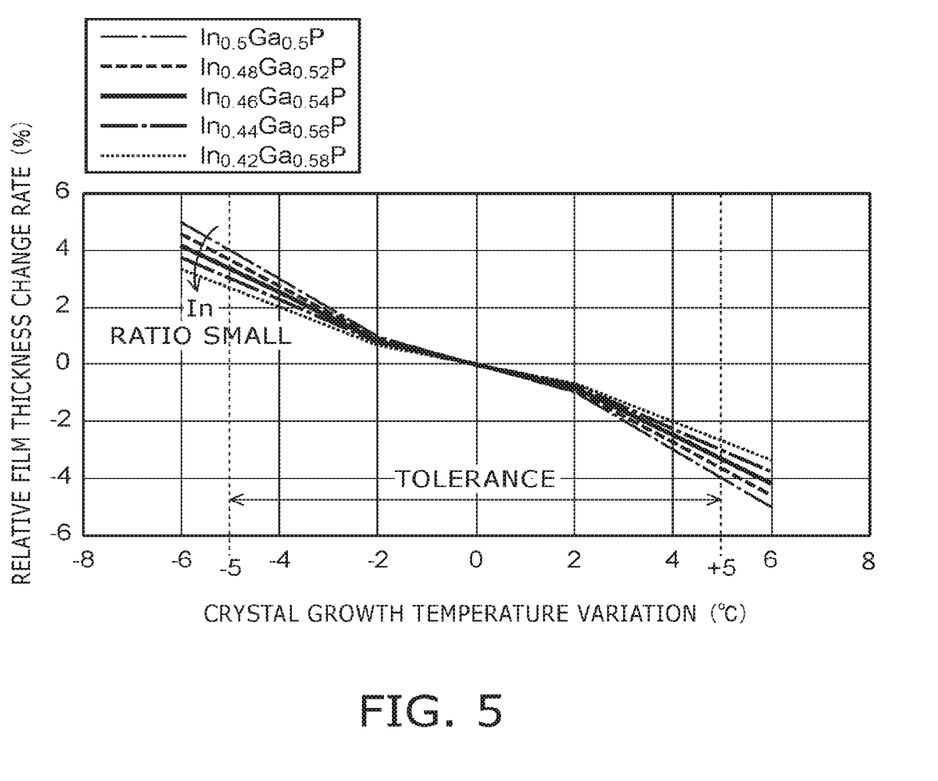
FIG. 5 is a simulation graph view showing dependence of a relative film thickness change rate of $In_zGa_{1-z}P$ on variation of a crystal growth temperature.

FIG. 5 is a simulation graph view showing dependence of a relative film thickness change rate of $In_zGa_{1-z}P$ on variation of a crystal growth temperature.

The In mixed crystal ratio z decreases from 0.5 to 0.42, and the relative film thickness change rate decreases from 4% to 2.8%. That is, as the In mixed crystal ratio z is smaller, the relative film thickness change rate within the allowable range of crystal growth temperature variation (set temperature±5° C.) in the first layer 52 constituting the DBR can be reduced.

Figure 6:
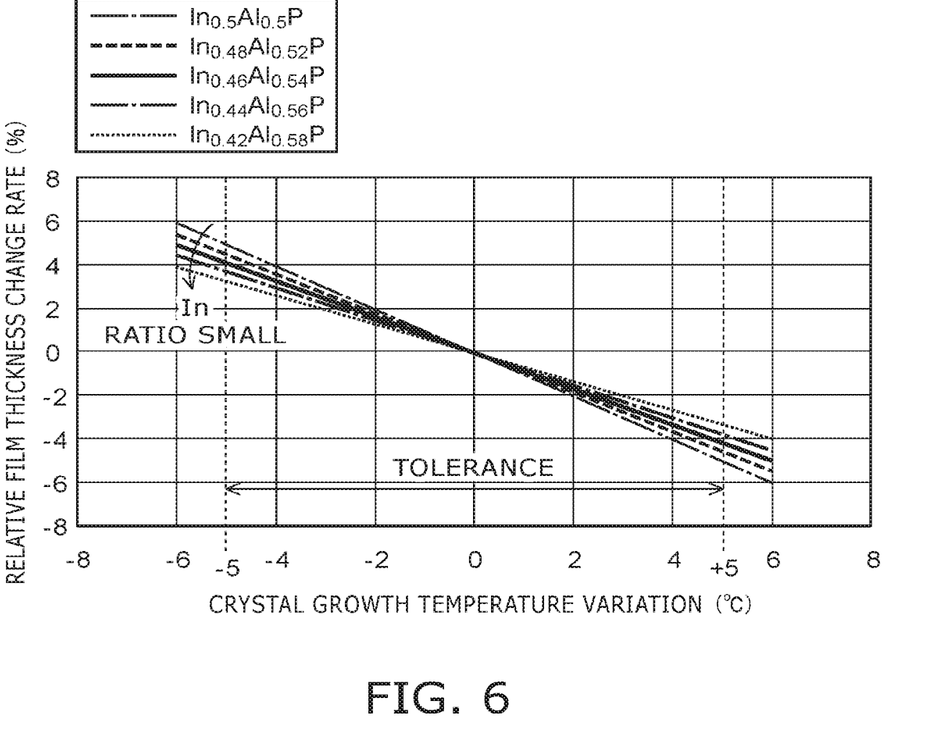
FIG. 6 is a simulation graph view showing dependence of a relative film thickness change rate of $In_zAl_{1-z}P$ on variation of a crystal growth temperature.

FIG. 6 is a simulation graph view showing dependence of a relative film thickness change rate of $In_zAl_{1-z}P$ on variation of a crystal growth temperature.

The In mixed crystal ratio z decreases from 0.5 to 0.42, and the relative film thickness change rate decreases from 5% to 3.3%. That is, as the In mixed crystal ratio z is smaller, the relative film thickness change rate within the allowable range of crystal growth temperature variation (set temperature±5° C.) in the first layer 52 constituting the DBR can be reduced. The second layer 54 is $In_zGa_{1-z}P$ in FIG. 5 and $In_zAl_{1-z}P$ in FIG. 6. Even if the second layer 54 is $In_z(Al_yGa_{1-y})_{1-z}P$, the variation range of the relative film thickness change rate is almost the same as in FIG. 5 and FIG. 6.

Figure 7:
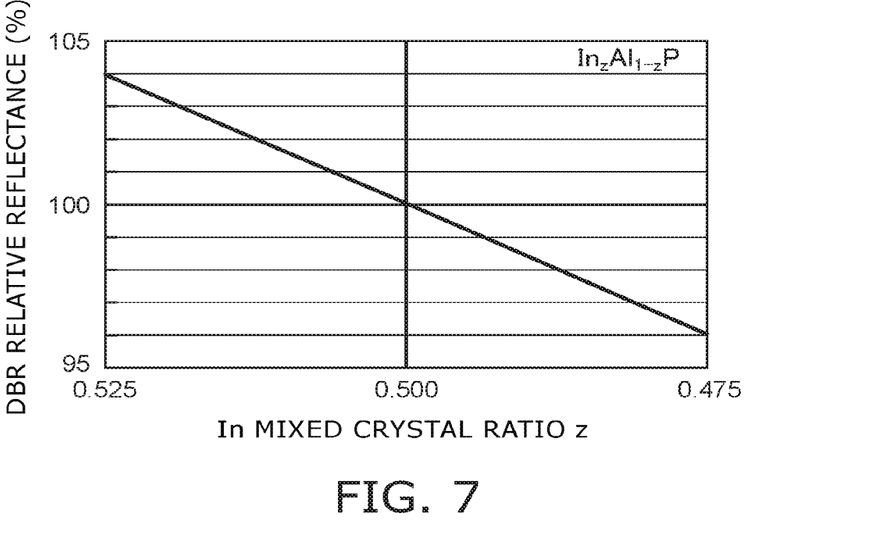
FIG. 7 is a simulation graph view showing dependence of a DBR relative reflectance on an In mixed crystal ratio z of $In_zAl_{1-z}P$.

FIG. 7 is a simulation graph view showing dependence of a DBR relative reflectance on an In mixed crystal ratio z of $In_zAl_{1-z}P$.

The vertical axis represents the DBR relative reflectance (%), and the horizontal axis represents the In mixed crystal ratio z. The relative reflectance is 100% when the In mixed crystal ratio z=0.50. As the In mixed crystal ratio z decreases (rightward in the horizontal axis), the DBR relative reflectance decreases gradually, and decreases to about 93% at z=0.45. That is, when the mixed crystal ratio of the first layer (AlGaAs) 52 is fixed and the In mixed crystal ratio z of $In_zAl_{1-z}P$ of the second layer 54 is changed, the relative reflectance of the DBR decreases as the In mixed crystal ratio z is smaller.

Figure 8A:
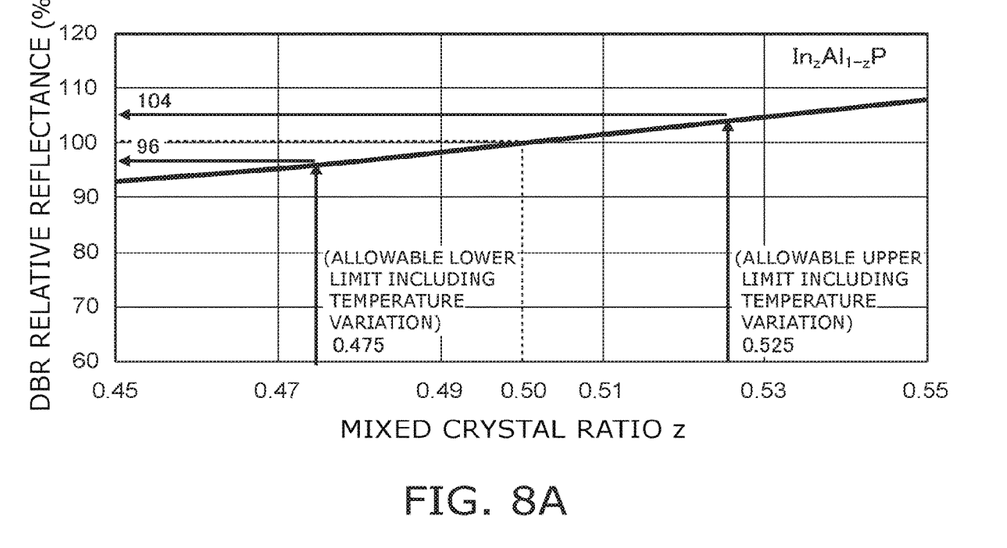
FIG. 8A is a simulation graph view of a DBR relative reflectance at z=0.50 of a second embodiment.
Figure 8B:
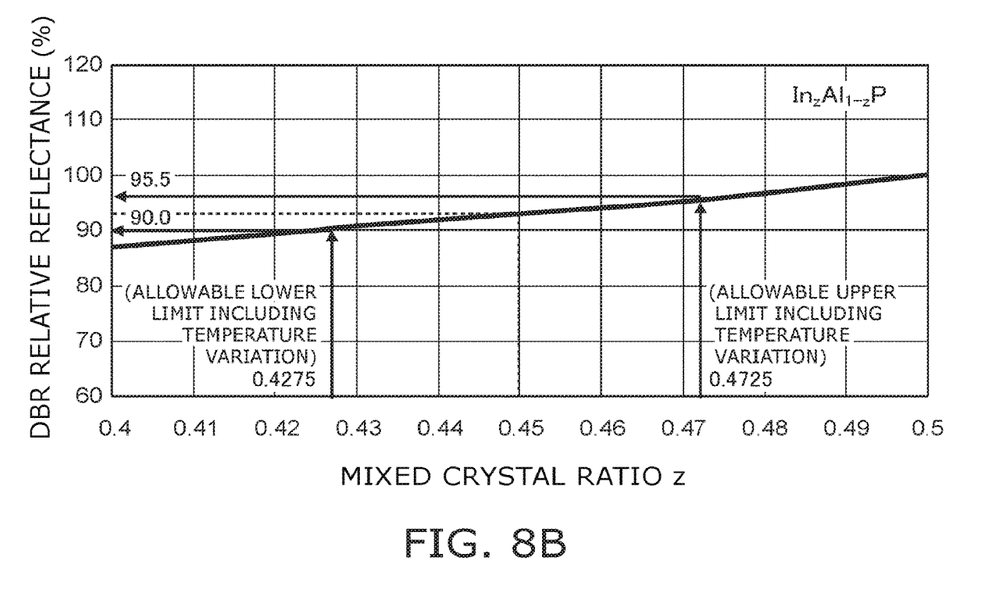
FIG. 8B is a simulation graph view of a DBR relative reflectance at z=0.45 of the second embodiment.

FIG. 8A is a simulation graph view of a DBR relative reflectance at z=0.50 of a second embodiment, and FIG. 8B is a simulation graph view of a DBR relative reflectance at z=0.45 of the second embodiment.

The vertical axis represents the DBR relative reflectance (%), and the horizontal axis represents the In mixed crystal ratio z. The relative reflectance is 100% when z=0.50. The first layer 52 includes $Al_xGa_{1-x}As$, and the second layer 54 includes $In_zAl_{1-z}P$. In addition, the phase $\alpha_1$ of the first layer 52 is expressed by formula (1), and the phase $\alpha_2$ of the second layer 54 is expressed by formula (2). As in FIG. 2, the rate of change of the In composition ratio z was about ±5% with respect to the variation range of the crystal growth temperature±5° C.

In FIG. 8A, when the set value of the In mixed crystal ratio z is 0.5, the In mixed crystal ratio z varies in the range of 0.475 to 0.525 within the range of variation of the crystal growth temperature. At this time, the relative reflectance is 96 to 104% (variation range is 8%). On the other hand, in FIG. 8B, when the set value of the In mixed crystal ratio z is 0.45, the In mixed crystal ratio z varies in the range of 0.4275 to 0.4725 within the range of variation of the crystal growth temperature. At this time, the relative reflectance is expected to be 90.0 to 95.5% (the variation range is as small as 5.5%). However, if z<0.45, the lattice mismatch rate becomes higher with respect to the GaAs substrate, and therefore z≥0.45.

Further, z≤0.525 is set. That is, as the In composition ratio z is lowered from 0.5 to 0.45, the variation range of the relative reflectance can be reduced, and the luminous output variation width in the wafer surface can be reduced.

According to the embodiment, variations in the optical output within a wafer can be suppressed. As a result, optical semiconductors can be stably produced while suppressing lot to lot fluctuations in optical output characteristics within a tolerance of variation range of the crystal growth temperature. The optical semiconductor element of the embodiment is widely used for photocouplers and photorelays that can transmit signals in a state where input and output are electrically insulated.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. An optical semiconductor element, comprising:
    a substrate;
    a light emitting layer including an AlGaAs multi quantum well layer; and
    a distributed Bragg reflector provided between the substrate and the light emitting layer, the distributed Bragg reflector including a pair of a first layer and a second layer being periodically stacked, the first layer including $Al_xGa_{1-x}As$, the second layer including $In_z(Al_yGa_{1-y})_{1-z}P$,
    a refractive index $n_1$ of the first layer being higher than a refractive index $n_2$ of the second layer,
    the first layer having a thickness larger than $\lambda 0/(4n_1)$ where $\lambda 0$ is a center wavelength of a band on wavelength distribution of a reflectivity of the distributed Bragg reflector, and
    the second layer having a thickness smaller than $\lambda 0/(4n_2)$,
    wherein an In mixed crystal ratio z of the second layer is $0.45 \leq z \leq 0.525$.

2. The element according to claim 1, wherein the center wavelength is 700 nm or more.

3. The element according to claim 1, wherein the substrate includes GaAs.

* * * * *